United States Patent [19]

Hawkins et al.

[11] Patent Number: 5,244,817
[45] Date of Patent: Sep. 14, 1993

[54] METHOD OF MAKING BACKSIDE ILLUMINATED IMAGE SENSORS

[75] Inventors: Gilbert A. Hawkins, Mendon; Ronald M. Gluck, Rochester, both of N.Y.

[73] Assignee: Eastman Kodak Company, Rochester, N.Y.

[21] Appl. No.: 923,674

[22] Filed: Aug. 3, 1992

[51] Int. Cl.$^5$ ............................................. H01L 31/18
[52] U.S. Cl. .......................................... 437/2; 437/53; 437/236; 437/974; 148/DIG. 12; 148/DIG. 135
[58] Field of Search .................... 437/2, 4, 5, 974, 225, 437/53, 236; 148/DIG. 12, DIG. 135

[56] References Cited

U.S. PATENT DOCUMENTS

| | | | |
|---|---|---|---|
| 3,922,705 | 11/1975 | Yerman | 437/901 |
| 4,266,334 | 5/1981 | Edwards et al. | |
| 4,317,125 | 2/1982 | Hughes et al. | 437/974 |
| 4,321,747 | 3/1982 | Takemura et al. | 437/2 |
| 4,771,016 | 9/1988 | Bajor et al. | 148/DIG. 150 |
| 4,946,716 | 8/1990 | Corrie | 437/974 |
| 5,013,681 | 5/1991 | Godbey et al. | 437/83 |
| 5,110,748 | 5/1992 | Sarma | 148/DIG. 150 |

FOREIGN PATENT DOCUMENTS

| | | | |
|---|---|---|---|
| 53-30284 | 3/1978 | Japan | 437/974 |
| 1-215041 | 8/1989 | Japan | 148/DIG. 12 |
| 1-226167 | 9/1989 | Japan | 437/974 |
| 0177434 | 7/1990 | Japan | 148/DIG. 12 |

OTHER PUBLICATIONS

Blouke et al, Large Format, High Resolution Image Sensors, Optical Engineering, vol. 26, No. 9, 837 (1987).
Huang et al, A Wafer-Scale Thinning Process for High Performance Silicon Devices, Abstract 481, 174th Electrochemical Society Mtg., 88 2, 705 (1988).
Janesick et al, Charge Coupled Device Pinning Technologies, SPIE Optical Sensors and Electronic Photography, vol. 1071-15, Jan. 1989.
W. P. Maszara et al, Bonding of Silicon Wafers for Silicon-on-Insulator, J. Appl. Phys. 64 (10) Nov. 1988, 4943.
Seidel et al, Aniostropic Etching of Crystalline Silicone in Alkaline Solutions, J. Electrochem. Soc. vol. 137 No. 11, Nov. 1990, 3626.
Muraoka et al, Controlled Preferential Etching Technology, Semiconductor Silicon 1973, Electrochemical Society, 327, 1973.

*Primary Examiner*—Brian E. Hearn
*Assistant Examiner*—Michael Trinh
*Attorney, Agent, or Firm*—Raymond L. Owens

[57] ABSTRACT

A method of making a backside illuminated image includes forming a device on the frontside of thin device layer provided on an oxide layer which is mounted on a sacrificial substrate and bonding the front side of the device layer to a permanent silicon support substrate. Thereafter, the oxide layer and sacrificial layer are removed by chemical etching to expose the backside of the thin device layer.

2 Claims, 2 Drawing Sheets

METHOD OF MAKING BACKSIDE ILLUMINATED IMAGE SENSORS

FIELD OF THE INVENTION

The present invention relates to the making of backside illuminated image sensors.

BACKGROUND OF THE INVENTION

High quantum efficiency and broad spectral range are desirable features for solid state image sensors. A preferred method to increase quantum efficiency is to decrease the absorption of light by material or regions of the device which do not produce signal charge. Backside illumination of sensors can accomplish this purpose provided the device wafer is thinned and provided the electrical potential of the back surface is controlled. Various procedures have been reported for backside thinning and for control of the back surface potential. See J. Janesick et al. "CCD Pinning Technologies", SPIE Optical Sensors and Electronic Photography, Vol. 1071-15, Los Angeles, Jan 16-18, (1989); C. M. Huang et al., "A Wafer-Scale Thinning Process for High-Performance Silicon Devices", Abstract No. 481, 174th Electrochemical Society Mtg., 88-2, 705 (1988); T. W. Edwards and R. S. Pennypacker, U.S. Pat. No. 4,266,334, May 21, 1981; and M. Blouke et al., "Large format, high resolution image sensors", Optical Engineering, Vol. 26, No. 9, 837, (1987). However, these methods are complex and generally involve substantial processing after imager fabrication. Existing fabrication methods thin the device wafer after the devices have received most of the steps involved in their manufacture. Yield losses incurred due to thinning and backside accumulation operations are expensive since a great deal of processing has been invested in the devices prior to thinning. In addition, some methods require contacting of the device bond pads from the wafer backside. This involves aligning backside masks to the frontside device structures and etching contact holes to the bond pads. This is a complex and expensive process. Yield loss is also substantial. Also, some processing techniques degrade device performance and/or do not produce reliable results.

SUMMARY OF THE INVENTION

It is an object of the present invention to provide an improved method for providing backside illuminated image sensors which eliminates the problems noted above.

This is object is achieved in a method of making an image sensor which will be backside illuminated, comprising the steps of:
(a) forming a device on the front side of a thin device layer provided on an oxide layer which is mounted on a sacrificial substrate;
(b) bonding the front side of the device layer to a permanent silicon support substrate; and
(c) removing by chemical etching the oxide layer and the sacrificial substrate.

A feature of this invention is that image sensors can be made which are compatible with LSI technology.

Another feature is that no polishing or high temperature processing is required after attachment of the support substrate.

Another feature is that device fabrication on the thinned device layer can be accomplished with existing processes used for silicon of conventional thickness because an oxide-oxide bond is capable of withstanding all image processing temperatures and because the support substrate is silicon.

MODES OF CARRYING OUT THE INVENTION

Figure 1:
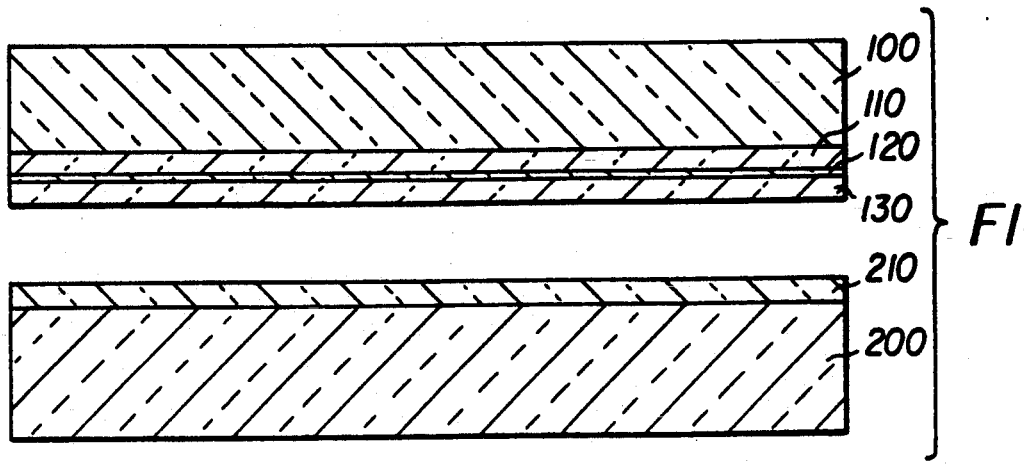
FIGS. 1-6 illustrate various steps in the method of making image sensors in accordance with this invention.

Turning first to FIG. 1, we see a p+ doped sacrificial silicon substrate 100. An epitaxial silicon device layer 110 of the p-type is formed on the substrate 100. Such a layer can be made by chemical vapor deposition in an epitaxial reactor, as is commonly practiced. A thermal oxide 130 has been formed on the device layer 110 by furnace oxidation. Boron ions are implanted to form a region 120 at the interface of device layer 110 and oxide layer 130, this region will act to control the electric field profile at the backside of the finished device. Boron containing region 120 can be accomplished by ion implantation either before or after formation of thermal oxide layer 130. Alternatively, boron containing region 120 can be accomplished by depositing on top of thermal oxide layer 130 a layer of borosilicate glass (BSG) having a concentration of $B_2O_3$ of typically 2 to 17 mole percent of thickness typically 500–1200 Å. During subsequent thermal processing steps of device fabrication, boron diffuses through layer 130 to form doped region 120. Also, use of a borosilicate glass layer interposed between the quartz and silicon layer reduces thermally induced stress to manageable levels by providing a material with expansion coefficient intermediate between that of quartz and silicon. The thermal expansion and contraction match of borosilicate glass and silicon can improve with increasing boron content up to 30 mole percent. Upon device completion region 120 is on the imager backside.

Referring again to FIG. 1, we see an oxide layer 210 provided on another silicon support sacrificial substrate 200. The oxide layers 130 and 210 are bonded together by placing the oxide layers in intimate contact and heating typically in the temperature range 400°–900° C. for 1-30 minutes. The nature of the substrates is not important in bonding provided there is a good adhesion of the oxides to the substrates and that the substrates are not compromised by the heating process See, for example, Maszara et al, "Bonding of silicon wafers for silicon-on-insulator", J. Applied Physics 64(10) 4943 (1988). The Maszara et al technique involves bonding of oxides which have been hydrated by exposure to ammonium hydroxide solutions and/or water rinses. The wafers to be bonded are subjected to a cleaning process in a clean room environment to remove surface particulates. The cleaning process may involve mechanical removal using commercial scrubbers followed by an exposure to 1:1:5 mixture of hydrogen peroxide (30%), ammonium hydroxide (30%) and deionized water at 80° C. for 20 minutes. Following a deionized water rinse and a drying operation the wafers are aligned so that surface 120 of the quartz wafer contacts surface 230 of the silicon wafer. The peripheral regions of the wafers and the flatted regions are also aligned so that after bonding, the composite will appear as a single double thick wafer with a major flat. The bonding is initiated by the application of pressure from a point source at one edge of the aligned wafers. Following the initial bonding process, the composite wafer is subjected to a thermal process to strengthen the bond. The thermal process is non-critical, with parameters ranging from 10 minutes at 300° C. to 30 seconds at 1000° C. or higher. During heating, the hydrogen bonds formed from the interaction of surface hydroxyl groups react to eliminate water and begin to form Si-O-Si bonded structures.

Figure 2:
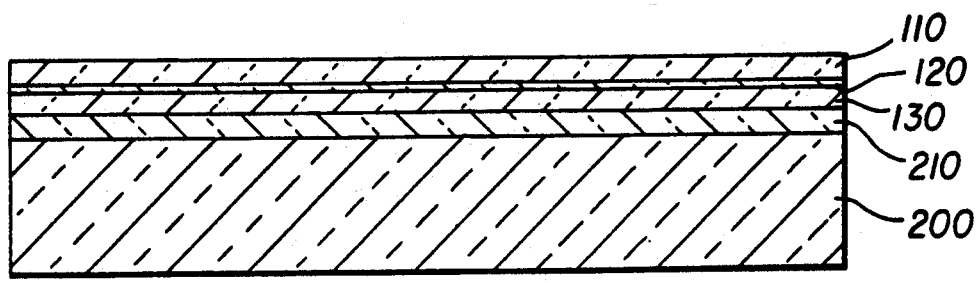

Turning now to FIG. 2, substrate 100 has already been removed by lapping, polishing and selective etching to expose the top surface of the thin device layer 110. Substrate 100 is selectively removed by chemical etches which attack highly doped p+silicon but not lightly doped silicon.

Methods for providing silicon etch stops have been disclosed. For example, see W. P. Maszara et al., J. Applied Physics 64(10) 4943 (1988); H. Seidel et al, "Anisotropic Etching of Crystalline Silicon in Alkaline Solutions", J. Electrochemical Society, Vol. 137, No. 11, 3626 (1990); H. Muraoka et al. "Controlled Preferential Etching Technology", in Semiconductor Silicon 1973, edited by H. R. Huff and R. R. Burgess, Princeton, N.J. Electrochemical Society, 327, (1973). For example, an etchant designed to etch highly boron doped ($>10^{18}/cm^3$) silicon rapidly, but to etch silicon boron doped at less than $10^{18}/cm^3$ slowly. Such an etch is composed of 1 part by volume hydrofluoride acid (49%), 3 parts by volume nitric acid (70%) and 8 parts by volume acetic acid (100%) (1:1:8). Depending on the boron concentration of the highly doped layer, the selectivity of this etch is reported to be in the range of 25:1 to 100:1.

This etch is performed at room temperature in an ultrasonically agitated solution. In order to maintain optimum selectivity $H_2O_2$ is added dropwise to the etch bath as a yellowing is observed. The $H_2O_2$ oxidizes the $HNO_2$, if present, would attack the player, reducing the selectivity. The etch stop is observed as the formation of a bright, smooth, silvery layer in contrast to the p+layer being etched. There are, however, dark stained regions that are formed as well. These stained regions are removed by a brief exposure to a destaining solution composed of one gram potassium permanganate dissolved in a mixture of 150 $cm^3$ of 49% HF and 150 $cm^3$ of glacial (100%) acetic acid.

In practice, the transition from heavily doped layer 100 to lightly doped layer 110 may not be perfectly abrupt and the etch may terminate in a transition layer of intermediate doping. In this case, it is desirable to remove the transition layer with an etch process which removes silicon at a constant rate independent of the boron concentration variation in the range below $10^{18}/cm^3$. An etchant such as 10% KOH at 40° C. which dissolves silicon at 100 nanometers per minute can be used on a timed basis to etch the silicon to its bulk EPI value of $3 \times 10^{15}$ boron/$cm^3$.

It is also possible to mechanically thin region 100, for example, by grinding and lapping as is conventionally practiced, prior to chemical etching in order to reduce the time required for the etch and to improve the thickness uniformity of region 100 after the etch.

Figure 3:
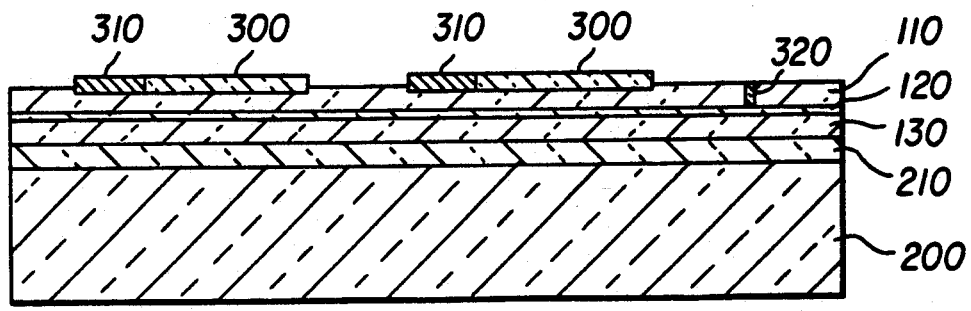

In FIG. 3, bondpads 310 and devices 300 are formed in and on the thin device layer 110 by conventional processing techniques such as, for example, deposition of thin film nitrides, oxides polysilicon and metal layers, lithographic patterning and etching of such layers, ion implantation, annealing and oxide growth. Trench etches 320 which penetrate all or most of layer 110 are defined for ease of alignment during subsequent processing.

Figure 4:
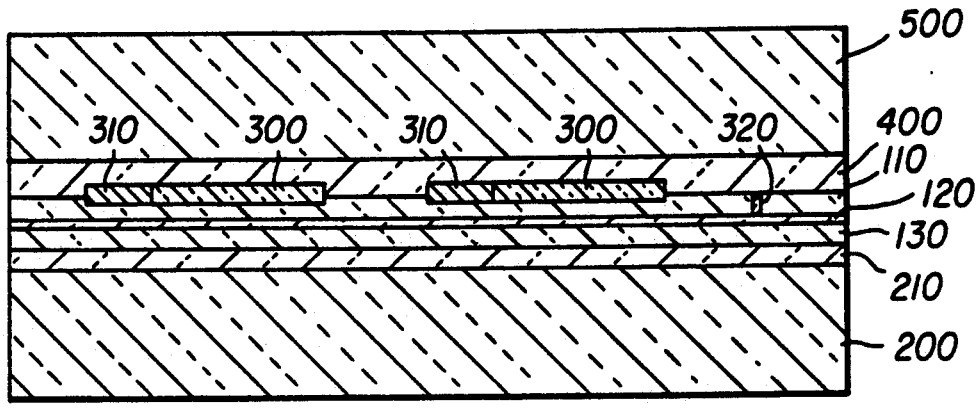

In FIG. 4, we see a permanent silicon support substrate 500 which is fixed to the thin device layer 110 by an epoxy layer 400, such as for example, Epotek 377.

Figure 5:
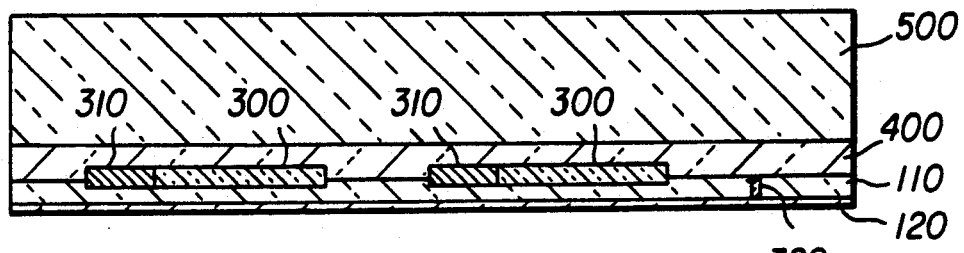

In FIG. 5, the sacrificial support substrate 200 and oxide layers 210 and 130 are now removed by chemical etching for example by HF acid or buffered oxide etch as is conventionally practiced. Substrate 500 may be conveniently protected from this etch by wax or silicon nitride applied, if required. Region 120 acts as an etch stop. The backside region 120 of the device layer is now exposed.

Figure 6:
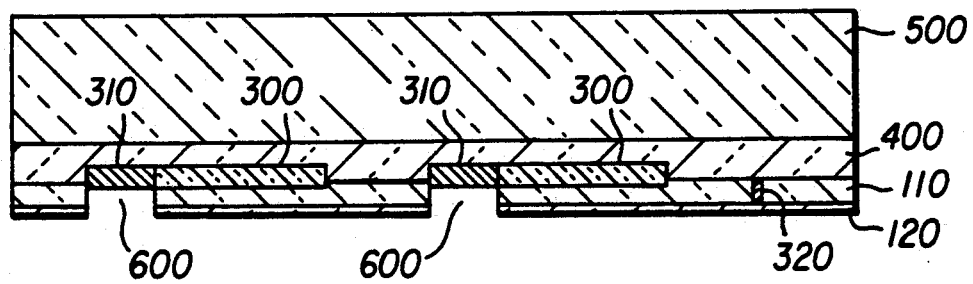

As shown in FIG. 6 patterned openings 600 are formed in the layer 110 by conventional lithographic processes such as photoresists definition and dry etching. Subsequently, the device will be packaged by conventional means.

ADVANTAGES

A preferred method to increase quantum efficiency of solid state imagers is to illuminate the devices from the backside. In order to limit backside absorption in silicon technology, it is necessary to thin the silicon substrates. This step is accomplished in the present invention by a means affording higher yield than conventional thinning processes. This is because conventional thinning is performed near the end of device processing. Breakage or imperfections such as scratches or strains introduced at this stage of the process cannot be repaired; thus the reduction in total yield is costly. The thinning taught in accordance with the current invention occurs near the beginning of the process. Wafers experiencing identifiable damage, such as breakage, scratches, or strain, may be discarded early on, thus limiting the cost penalty for thinning. Moreover, the current invention provides, after oxide bonding and thinning, a device substrate which is compatible with conventional silicon processing and which require no alteration in process steps. For example, the weight and optical constants of the starting material are sufficiently near to those of conventional starting wafers that wafer detection mechanisms are on automated handling equipment accept the substrates without modification. High temperature processes, etches, and lithography are also compatible with the thinned substrates. The additional steps required according to the current invention after device fabrication are non-critical and do not introduce appreciable yield loss or performance compromise.

The invention has been described in detail with particular reference to certain preferred embodiments thereof, but it will be understood that variations and modifications can be effected within the spirit and scope of the invention.

We claim:

1. In a method of making an image sensor which will be backside illuminated, comprising the steps of:
    (a) forming a first oxide layer on a thin epitaxial device layer grown on a first sacrificial silicon substrate;
    (b) forming a boron containing region at the interface of the backside of the device layer and the first oxide layer which acts as a chemical etch stop;
    (c) bonding a second oxide layer on a second sacrificial silicon substrate with the first oxide layer;
    (d) removing the first sacrificial substrate by chemical etching to expose the front surface of the thin epitaxal device layer;

(e) after step (d) forming devices and bondpads in and on the front surface of the thin epitaxial device layer;

(f) bonding the thin device layer to a permanent silicon support substrate; and (g) removing by chemical etching the second oxide layer and the second sacrificial silicon substrate.

2. The method of claim 1 wherein the thin device layer is bonded by an epitaxial layer to the support substrate.

* * * * *